(12) United States Patent
Weimer

(10) Patent No.: US 7,416,933 B2
(45) Date of Patent: Aug. 26, 2008

(54) METHODS OF ENABLING POLYSILICON GATE ELECTRODES FOR HIGH-K GATE DIELECTRICS

(75) Inventor: Ronald A. Weimer, Boise, ID (US)

(73) Assignee: Micron Technology, Inc., Boise, ID (US)

( * ) Notice: Subject to any disclaimer, the term of this patent is extended or adjusted under 35 U.S.C. 154(b) by 0 days.

(21) Appl. No.: 10/913,281

(22) Filed: Aug. 6, 2004

(65) Prior Publication Data

US 2006/0030096 A1   Feb. 9, 2006

(51) Int. Cl.
*H01L 21/8238* (2006.01)

(52) U.S. Cl. ............... 438/199; 438/216; 438/288; 438/261; 257/E21.639

(58) Field of Classification Search ........ 438/199, 438/216, 288, 261; 257/E21.261
See application file for complete search history.

(56) References Cited

U.S. PATENT DOCUMENTS

| | | | | |
|---|---|---|---|---|
| 6,166,417 | A * | 12/2000 | Bai et al. | 257/407 |
| 6,492,217 | B1 * | 12/2002 | Bai et al. | 438/199 |
| 6,861,304 | B2 * | 3/2005 | Hisamoto et al. | 438/197 |
| 6,872,613 | B1 * | 3/2005 | Xiang et al. | 438/199 |
| 6,906,398 | B2 * | 6/2005 | Yeo et al. | 257/500 |
| 7,023,064 | B2 * | 4/2006 | Park et al. | 257/412 |
| 7,045,847 | B2 * | 5/2006 | Lin et al. | 257/310 |
| 7,105,889 | B2 * | 9/2006 | Bojarczuk et al. | 257/324 |
| 2003/0137017 | A1 * | 7/2003 | Hisamoto et al. | 257/407 |
| 2005/0035345 | A1 * | 2/2005 | Lin et al. | 257/20 |
| 2005/0269634 | A1 * | 12/2005 | Bojarczuk et al. | 257/338 |
| 2005/0269635 | A1 * | 12/2005 | Bojarczuk et al. | 257/338 |
| 2005/0280099 | A1 * | 12/2005 | Park et al. | 257/374 |
| 2005/0280104 | A1 * | 12/2005 | Li | 257/406 |
| 2005/0282329 | A1 * | 12/2005 | Li | 438/216 |
| 2006/0040439 | A1 * | 2/2006 | Park et al. | 438/199 |
| 2006/0102968 | A1 * | 5/2006 | Bojarczuk et al. | 257/392 |
| 2006/0118879 | A1 * | 6/2006 | Li | 257/369 |
| 2006/0275977 | A1 * | 12/2006 | Bojarczuk et al. | 438/216 |

OTHER PUBLICATIONS

"Fermi-Level Pinning Induced Thermal Instability in the Effective Work Function of TaN in TaN/SiO2 Gate Stack", C. Ren, et al., IEEE Electron Device Letters, vol. 25, No. 3, Mar. 2004, pp. 123-125.

(Continued)

*Primary Examiner*—Scott B. Geyer
*Assistant Examiner*—Stanetta D Isaac
(74) *Attorney, Agent, or Firm*—Mike Romani

(57) ABSTRACT

Complementary transistors and methods of forming the complementary transistors on a semiconductor assembly are described. The transistors are formed with an optional interfacial oxide, such as $SiO_2$ or oxy-nitride, to overlay a semiconductor substrate which will be conductively doped for PMOS and NMOS regions. Then a dielectric possessing a high dielectric constant of least seven or greater (also referred to as a high-k dielectric) is deposited on the interfacial oxide. The high-k dielectric is covered with a thin monolayer of metal oxide (i.e., aluminum oxide, $Al_2O_3$) that is removed from the NMOS regions, but remains in the PMOS regions. The resulting NMOS transistor diffusion regions contain predominately metal to silicon bonds that create predominately Fermi level pinning near the valence band while the resulting PMOS transistor diffusion regions contain metal to silicon bonds that create predominately Fermi level pinning near the conduction band.

20 Claims, 4 Drawing Sheets

OTHER PUBLICATIONS

"Effects of High-K Dielectrics on the Workfunctions of Metal and Silicon Gates", Yee-Chia Yeo, et al., 2001 Symposium of VLSI Technology Digest of Techical Papers.

"Effect of Polycrystalline-Silicon Gate Types on the Opposite Flatband Voltage Shift in N-Type and P-Type Metal-Oxide-Semiconductor Field-Effect Transistors for High-K-HfO2 Dielectric", C.W. Yang, et al., Applied Physics Letters, vol. 83, No. 2, Jul. 14, 2003, pp. 308-310.

"Fermi-Level Pinning at the Polysilicon/Metal-Oxide Interface—Part II", Christopher C. Hobbs, et al., IEEE Transactions on Electron Devices, vol. 51, No. 6, Jun. 2004, pp. 978-984.

"Fermi Level Pinning at the PolySi/Metal Oxide Interface", C. Hobbs, et al., 2003 Symposium on VLSI Technology Digest of Technical Papers.

"Fermi-Level Pinning at the Polysilicon/Metal Oxide Interface—Part I", Christopher C. Hobbs, et al., IEEE Transactions on Electron Devices, vol. 51, No. 6, Jun. 2004, pp. 971-977.

* cited by examiner

METHODS OF ENABLING POLYSILICON GATE ELECTRODES FOR HIGH-K GATE DIELECTRICS

FIELD OF THE INVENTION

This invention relates to semiconductor devices and fabrication processes thereof. The invention particularly relates to complementary transistors and a method to fabricate the complementary transistors that utilize transistor gate dielectric materials possessing a high dielectric constant.

BACKGROUND OF THE INVENTION

Complementary Metal Oxide Semiconductor (CMOS) devices are dominated by n-channel (NMOS) and p-channel (PMOS) transistor structures. Various physical characteristics of each type of transistor determine the threshold voltage ($V_t$) that must be overcome to invert the channel region and cause a given transistor to conduct majority carriers (either by electrons movement in an NMOS device or by hole movement in a PMOS device).

One of the controlling physical characteristics is the work function of the material used to form the gate electrode of the transistor device. In semiconductor devices, such as a Dynamic Random Access Memory (DRAM) device, the transistor gates are predominantly made of polysilicon and an overlying layer of metal silicide, such as tungsten silicide and the gate dielectric is typically a high quality silicon oxide. The industry has moved to a transistor gate dielectric possessing a high dielectric constant of seven or greater (high-k dielectrics) for better leakage at given Effective Oxide Thickness (EOT). However, choosing a material with the appropriate work function as a gate electrode is still a challenge.

Studies have been conducted in one area of using high-k dielectric concerning Fermi-level pinning at the polysilicon/metal oxide interface of the transistor gate structure. Taking $HfO_2$, for example, the hafnium and the polysilicon form Hafnium-Silicon bonds whose energy level in the band gap causes the Fermi-Level of the polysilicon to be pinned near the conduction band. With this scenario, using the $HfO_2$ as the transistor gate dielectric in an NMOS device, a small shift in the transistor $V_t$, relative to N+ polysilicon on $SiO_2$ will occur due to Hafnium-Silicon interface. However, applying this case in a PMOS device, a large shift in the transistor $V_t$ will occur due to the Hafnium-Silicon bonds still pinning the Fermi-Level of the polysilicon near the conduction band.

Taking $Al_2O_3$, for example, the aluminum and the polysilicon form Aluminum-Silicon bonds that cause the Fermi-Level of the polysilicon to be pinned near the valence band due to the creation of the interface states that reside close to the valence band. With this scenario, using the $Al_2O_3$ as the transistor gate dielectric in a PMOS device, a small shift in the transistor $V_t$ will occur due to P+ Aluminum-Silicon interface. However, applying this case in an NMOS device a large shift in the transistor $V_t$ will occur due to the Aluminum-Silicon interface still having the Fermi-Level of the polysilicon being pinned near the conduction band and the transistor will not function in the desired range.

CMOS transistor devices that use the traditional polysilicon gate electrodes in combination with a metal oxide dielectric (high-k dielectric) must be fabricated such that the NMOS and PMOS devices will each possess a suitable transistor threshold voltage ($V_t$).

There is a need for the construction of CMOS devices using high-k dielectric materials for the transistor gate dielectric which will successfully be used to form both n-channel (NMOS) and p-channel (PMOS) transistors in semiconductor devices.

SUMMARY OF THE INVENTION

Exemplary implementations of the present invention include complementary transistors and methods of forming the complementary transistors on a semiconductor assembly by optionally forming an interfacial oxide, such as $SiO_2$ or oxy-nitride, for electron or hole mobility, to overlay a semiconductor substrate which will be conductively doped for PMOS and NMOS regions. Then a dielectric possessing a high dielectric constant of least seven or greater (also referred to herein as a high-k dielectric) is deposited on the interfacial oxide. The high-k dielectric is covered with a thin monolayer of metal oxide (i.e., aluminum oxide, $Al_2O_3$) that is removed from the NMOS regions, but remains in the PMOS regions. The resulting NMOS transistor diffusion regions contain predominately metal to silicon bonds that create predominately Fermi level pinning near the valence band while the resulting PMOS transistor diffusion regions contain metal to silicon bonds that create predominately Fermi level pinning near the conduction band.

DETAILED DESCRIPTION OF THE INVENTION

The following exemplary implementations are in reference to complementary transistors and the formation thereof. While the concepts of the present invention are conducive to transistor structures for semiconductor memory devices, the concepts taught herein may be applied to other semiconductor devices that would likewise benefit from the use of the process disclosed herein. Therefore, the depictions of the present invention in reference to transistor structures for semiconductor memory devices are not meant to so limit the extent to which one skilled in the art may apply the concepts taught hereinafter.

In the following description, the terms "wafer" and "substrate" are to be understood as a semiconductor-based material including silicon, silicon-on-insulator (SOI) or silicon-on-sapphire (SOS) technology, doped and undoped semiconductors, epitaxial layers of silicon supported by a base semiconductor foundation, and other semiconductor structures. Furthermore, when reference is made to a "wafer" or "substrate" in the following description, previous process steps may have been utilized to form regions or junctions in or over the base semiconductor structure or foundation. In addition, the semiconductor need not be silicon-based, but could be based on silicon-germanium, silicon-on-insulator, silicon-on-saphire, germanium, or gallium arsenide, among others.

Figure 1:
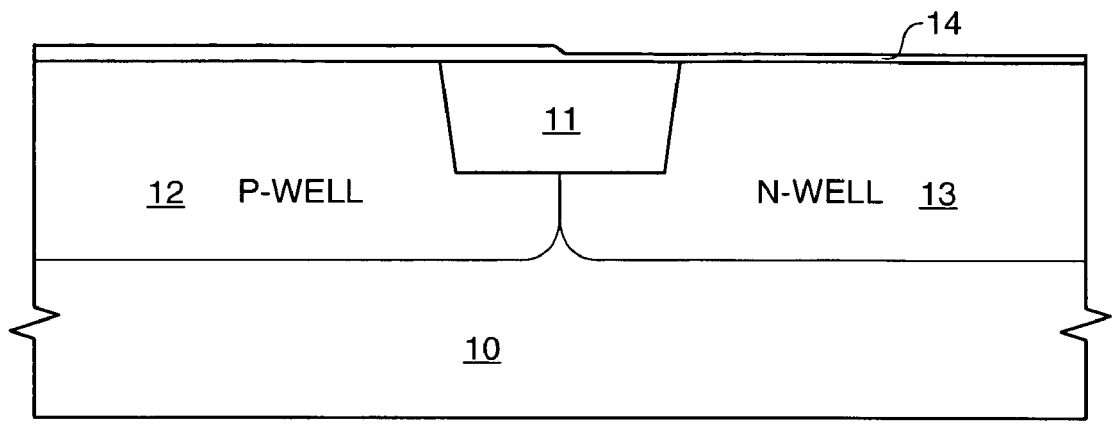
FIG. 1 is a cross-sectional view of a semiconductor substrate section showing the early stages of an semiconductor assembly having N-WELL and P-WELL regions formed in a silicon substrate partially separated by an isolation material and a thermally grown dielectric layer, which can having varying thickness, is formed over the Well regions, according to an embodiment of the present invention.

An exemplary implementation of the present invention is depicted in FIGS. 1-6. Referring now to FIG. 1, substrate 10 is processed to the point where P-WELL region 12 and N-WELL region 13 are formed in substrate 10. P-WELL region 12 represents a region containing a concentration of p-type conductive dopants, while N-WELL region 13 represents a region containing a concentration of n-type conductive dopants. Isolation material 11 partially separates and electrically isolates the upper portions of the Well regions from one another. Dielectric material 14 is deposited over the surfaces of N-WELL region 12, P-WELL region 13 and isolation material 11. Dielectric material 14 may be a thermally grown oxide material or a nitrided thermally grown oxide material formed by methods know to those skilled in the art. Though not shown, a boron barrier layer may also be included if desired.

Figure 2:
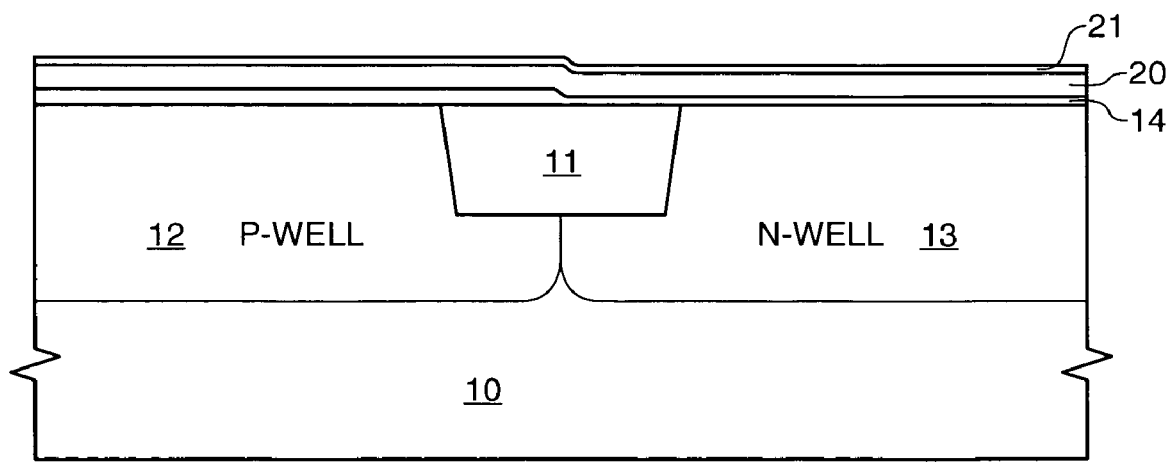
FIG. 2 is a subsequent cross-sectional view taken from FIG. 1 following the formation of a first high-k dielectric layer on the thermally grown dielectric layer which in turn is covered with a second high-k dielectric layer.

Referring now to FIG. 2, a first material 20 and second material 21, each being a high-k dielectric material, are deposited on dielectric material 14. The first material 20 may be a metal oxide, preferably $HfO_2$ or HfSiO and the second material 21 may be a metal oxide, preferably $Al_2O_3$. The first metal oxide dielectric material 20 must be a material that contains a metal component that when allowed to form a metal silicon interface (such an interface will be formed by a subsequent deposition of a polysilicon layer as described in reference to FIG. 5), the metal-Silicon bonds will create predominately Fermi level pinning near the valance band for a subsequently formed NMOS transistor. The second metal oxide dielectric material 21 must be a material that contains a metal component that when allowed to form a metal silicon interface, the metal-Silicon bonds will create predominately Fermi level pinning near the conduction band in a subsequently formed PMOS transistor. The second metal oxide dielectric material 21 is deposited by a Atomic Layer Deposition (ALD) process know to one skilled in the art. It is preferred that the second metal oxide dielectric material 21, such as $Al_2O_3$, be deposited only several monolayers in thickness (i.e., several atomic layers), such that a sufficient amount of aluminum atoms cover the surface of the first metal dielectric material in order to provide the desired Fermi-Level pinning as discussed in the subsequent processing steps.

Figure 3:
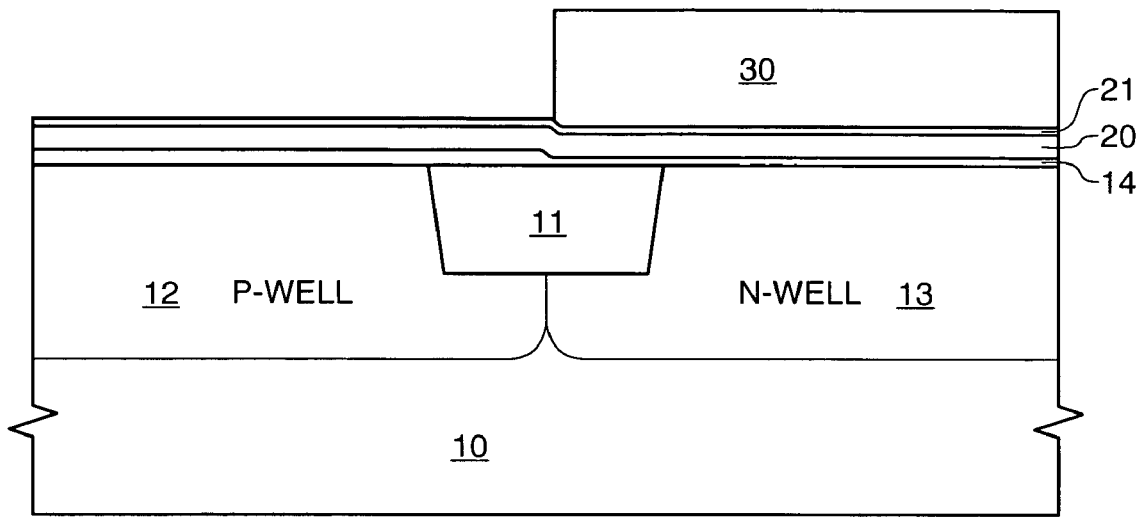
FIG. 3 is a subsequent cross-sectional view taken from FIG. 2 following the patterning of a photoresist over the N-WELL region, thus exposing the second high-k dielectric layer overlying the P-WELL region.

Referring now to FIG. 3, photoresist 30 is formed and patterned to cover the portion of second metal oxide dielectric material 21 that overlies N-WELL region 13, while exposing the portion of second metal oxide dielectric material 21 that overlies P-WELL region 12.

Figure 4:
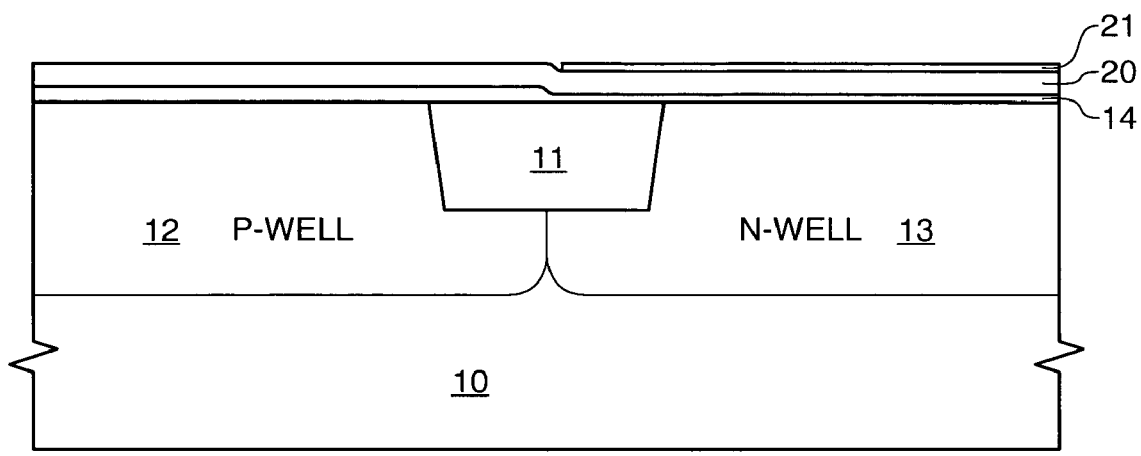
FIG. 4 is a subsequent cross-sectional view taken from FIG. 3 following removal of the exposed second high-k dielectric layer and the stripping of the photoresist.

Referring now to FIG. 4, the exposed portion of the second metal oxide dielectric material is removed and photoresist 30 is stripped, thus leaving behind the portion of second metal oxide dielectric material 21 that overlies N-WELL region 13. The remaining portion of second metal oxide dielectric material 21 will provide the necessary metal-silicon bonds required to create predominately Fermi level pinning near the conduction band in a subsequently formed PMOS transistor. For the exposed portion of the first metal oxide dielectric material the necessary metal-silicon bonds required to create predominately Fermi level pinning near the valance band in a subsequently formed NMOS transistor.

Figure 5:
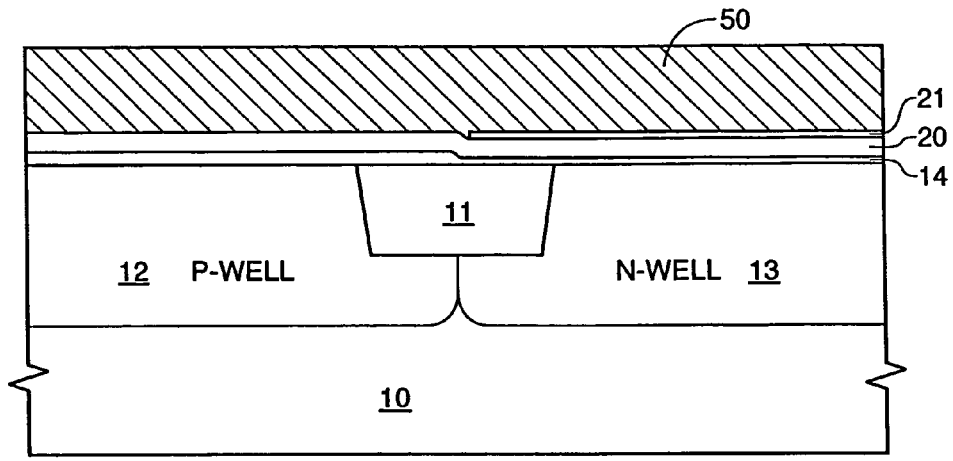
FIG. 5 is a subsequent cross-sectional view taken from FIG. 4 following the deposition of a polysilicon layer and conductive implanting thereof.

Referring now to FIG. 5, a silicon material 50, such as a polysilicon layer, is formed over the exposed portion of first metal oxide dielectric material 20 and the remaining portion of second metal dielectric material 21. The silicon material 50 creates a first interface between the first metal oxide dielectric material, containing metal 1 atoms (overlying the P-WELL region) and a second interface between the second metal oxide dielectric material containing metal 2 atoms (overlying the N-WELL region). During deposition of the silicon material, metal 1 to silicon bonds will form along the first interface. In the same manner metal 2 to silicon bonds will form along the second interface. In one example, if first metal oxide dielectric material is $HfO_2$ or HfSiO, hafnium to silicon bonds will be formed. If the second metal oxide dielectric material is $Al_2O_3$, then aluminum-silicon bonds will be formed.

Figure 6:
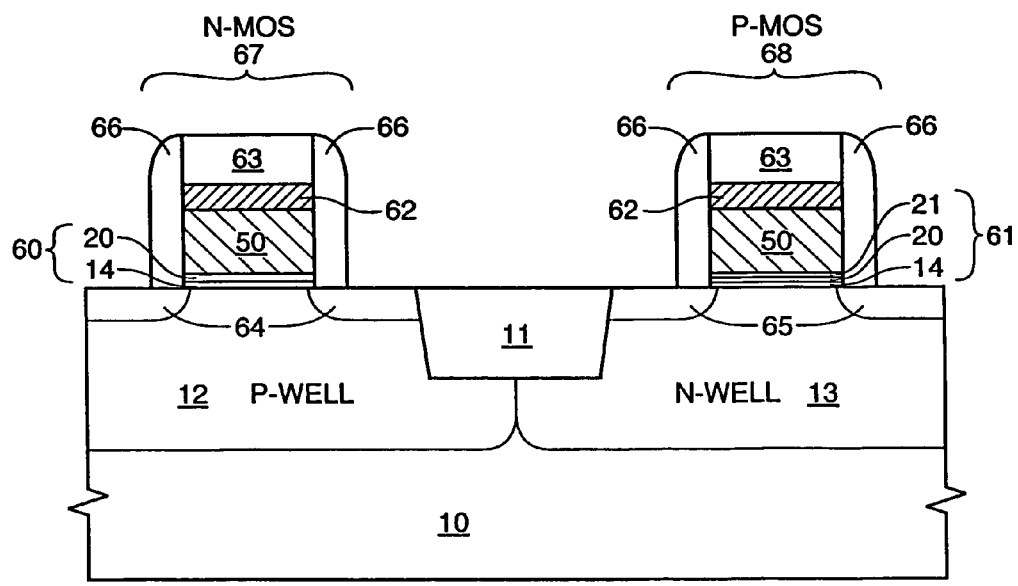
FIG. 6 is a subsequent cross-sectional view taken from FIG. 5 following the completion of a complementary transistor pair having differing transistor gate dielectrics.

Referring now to FIG. 6, process steps known to one skilled in the art are conducted to form a pair of completed CMOS transistors, namely NMOS transistor 67 and PMOS transistor 68, separated by trench isolation material 11. The transistors are formed using conventional fabrication techniques to pattern and etch each transistor gate, followed by implanting the source and drain regions 64 into P-WELL 12 to an n-type conductivity to form an n-channel transistor (NMOS) 67 and implanting the source and drain regions 65 into N-WELL 13 to a p-type conductivity to form a p-channel transistor (PMOS) 68. The transistor gate structure of NMOS transistor 67 is electrically isolated from P-WELL 12 by gate dielectric 60 which is made up of thermally grown oxide 14 and a first metal oxide dielectric material 20, such as $HfO_2$ The transistor gate structure is made up of silicon material 50, such as polysilicon and a metal silicide 62, such as tungsten silicide. The gate structure is then covered with isolation gate spacers 66 and isolation cap 63. Silicon material 50 and first metal oxide dielectric material form a metal dielectric/silicon interface and thus metal-silicon bonds in the NMOS transistor gate structure that create predominately Fermi level pinning near the valance band as described in the present invention. In the example using $HfO_2$ or HfSiO as the first metal oxide dielectric material, the hafnium atoms and the silicon atoms form hafnium-silicon bonds that create predominately Fermi level pinning near the valance band.

The transistor gate structure of PMOS transistor 68 is isolated from N-WELL 13 by gate dielectric 61, which is made up of thermally grown oxide 14, a first metal dielectric material 20, such as $HfO_2$, and a second metal oxide dielectric material 21, such as $Al_2O_3$. The transistor gate structure is made up of silicon material 50, such as polysilicon and a metal silicide 62, such as tungsten silicide. The gate structure is then covered with isolation gate spacers 66 and isolation cap 63. Silicon material 50 and second metal oxide dielectric material form a metal dielectric/silicon interface and thus metal-silicon bonds in the PMOS transistor gate structure that create predominately Fermi level pinning near the conduction band as described in the present invention. In the example using $Al_2O_3$ as the second metal oxide dielectric material, the aluminum atoms and the silicon atoms form aluminum-silicon bonds that create predominately Fermi level pinning near the conduction band.

The exemplary embodiment has been discussed in reference to forming a complementary transistor pair for use in CMOS applications, such as memory devices. However, these concepts, taught in the exemplary embodiments, may be utilized by one of ordinary skill in the art to form complementary transistor pairs for use in most all CMOS applications. For example, the present invention may be applied to a semiconductor system, such as the one depicted in FIG. 7, the general operation of which is known to one skilled in the art.

Figure 7:
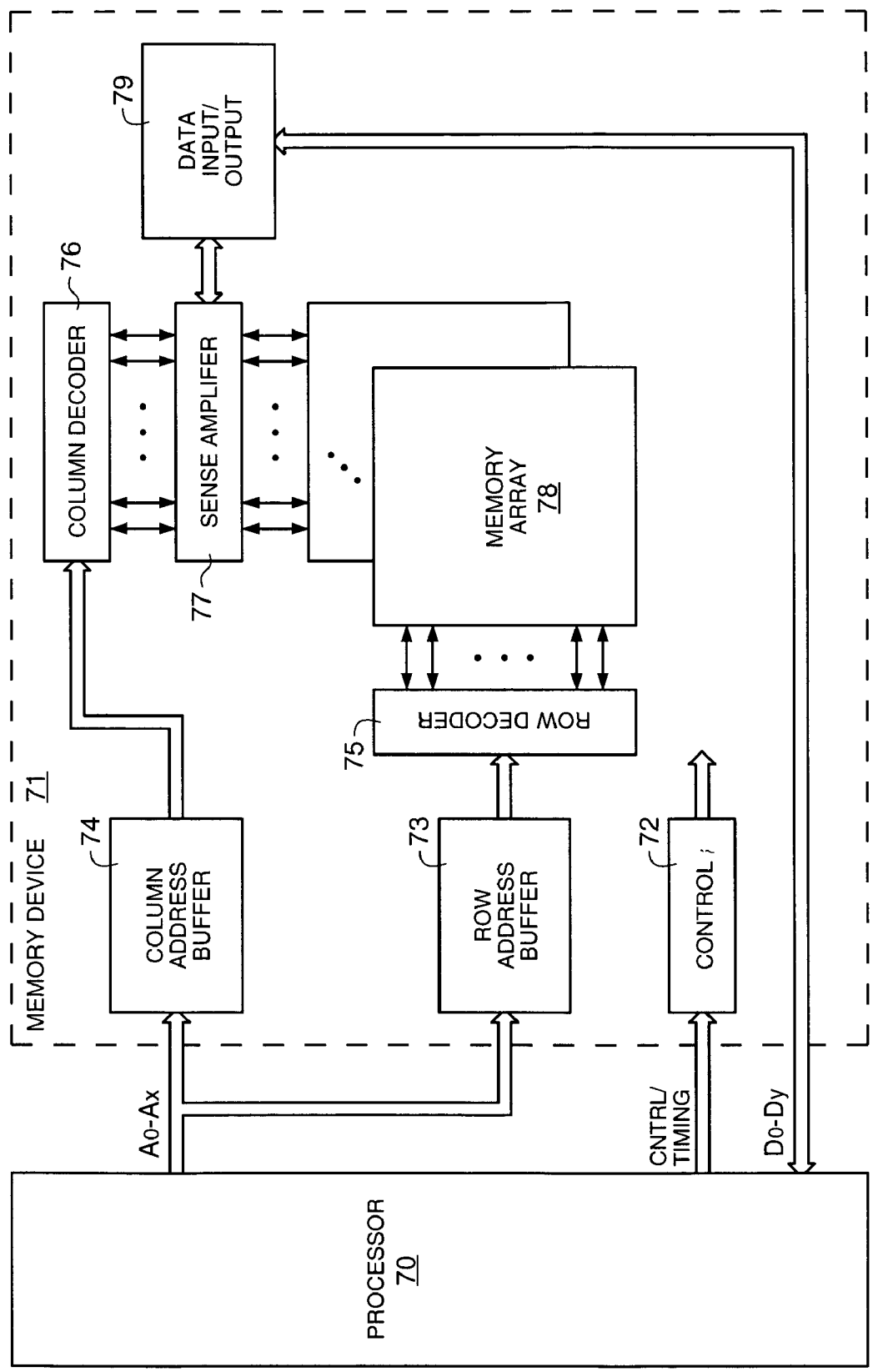
FIG. 7 is a simplified block diagram of a semiconductor system comprising a processor and memory device to which the present invention may be applied.

FIG. 7 represents a general block diagram of a semiconductor system comprising a processor 70 and a memory device 71 showing the basic sections of a memory integrated circuit, such as row and column address buffers, 73 and 74, row and column decoders, 75 and 76, sense amplifiers 77, memory array 78 and data input/output 79, which are manipulated by control/timing signals from the processor through control 72.

It is to be understood that, although the present invention has been described with reference to two exemplary embodiments, various modifications, known to those skilled in the art, may be made to the disclosed structure and process herein without departing from the invention as recited in the several claims appended hereto.

What is claimed is:

1. A method of forming complementary transistors on a semiconductor assembly comprising:
    forming a metal dielectric layer simultaneously over a first region having a concentration of n-type conductive dopants and a second region having a concentration of p-type conductive dopants;
    forming an $Al_2O_3$ layer on the metal dielectric layer in both the first region and the second region;
    masking the $Al_2O_3$ layer overlying the first region;
    removing the $Al_2O_3$ layer overlying the first region;
    forming a silicon material directly on the metal dielectric layer in the first region and the $Al_2O_3$ layer in the second region;
    forming an NMOS transistor comprising metal-silicon bonds that create predominately Fermi level pinning near the valance band; and
    forming a PMOS transistor comprising metal-silicon bonds that create predominately Fermi level pinning near the conductive band.

2. The method of claim 1, wherein the $Al_2O_3$ layer is deposited by Atomic Layer Deposition (ALD).

3. The method of claim 1, wherein the metal dielectric layer is a hafnium containing dielectric.

4. The method of claim 3, wherein the hafnium containing dielectric is $HfO_2$.

5. The method of claim 3, wherein the hafnium containing dielectric is HfSiO.

6. The method of claim 1, wherein the silicon material is polysilicon.

7. A method of forming complementary transistors on a semiconductor assembly comprising:
    forming a hafnium based oxide layer simultaneously over an N-WELL region and a P-WELL region;
    forming a $Al_2O_3$ layer on the hafnium based oxide layer in both the N-WELL region and P-WELL region;
    masking the $Al_2O_3$ layer overlying the N-WELL region;
    removing the $Al_2O_3$ layer overlying the P-WELL region;
    forming a polysilicon material directly on the hafnium based oxide layer in the P-WELL region and the $Al_2O_3$ layer in the N-WELL region;
    forming an NMOS transistor comprising hafnium-silicon bonds that create predominately Fermi level pinning near the valance band; and
    forming a PMOS transistor comprising aluminum-silicon bonds that create predominately Fermi level pinning near the conductive band.

8. The method of claim 7, wherein the $Al_2O_3$ layer is deposited by Atomic Layer Deposition (ALD).

9. The method of claim 7, wherein the hafnium based oxide layer is $HfO_2$.

10. The method of claim 7, wherein the hafnium based oxide layer is HfSiO.

11. A method of forming a semiconductor memory device having complementary transistors comprising:
    forming a first metal dielectric layer simultaneously over a first region having a concentration of n-type conductive dopants and a second region having a concentration of p-type conductive dopants;
    forming an $Al_2O_3$ layer on the metal dielectric layer;
    masking the $Al_2O_3$ layer overlying the first region;
    removing the $Al_2O_3$ layer overlying the first region;
    forming a silicon material directly on the metal dielectric layer in the first region and the $Al_2O_3$ layer in the second region;
    forming an NMOS transistor comprising metal-silicon bonds that create predominately Fermi level pinning near the valance band; and
    forming a PMOS transistor comprising metal-silicon bonds that create predominately Fermi level pinning near the conductive band.

12. The method of claim 11, wherein the $Al_2O_3$ layer is deposited by Atomic Layer Deposition (ALD).

13. The method of claim 11, wherein the metal dielectric layer is a hafnium containing dielectric.

14. The method of claim 13, wherein the hafnium containing dielectric is $HfO_2$.

15. The method of claim 13, wherein the hafnium containing dielectric is HfSiO.

16. The method of claim 11, wherein the silicon material is polysilicon.

17. A method of forming a semiconductor memory device having complementary transistors comprising:
    forming a hafnium based oxide layer simultaneously over an N-WELL region and a P-WELL region;
    forming a $Al_2O_3$ layer on the hafnium based oxide layer;
    masking the $Al_2O_3$ layer overlying the N-WELL region;
    removing the $Al_2O_3$ layer overlying the P-WELL region;
    forming a polysilicon material directly on the hafnium based oxide layer in the P-WELL region and the $Al_2O_3$ layer in the N-WELL region
    forming an NMOS transistor comprising hafnium-silicon bonds that create predominately Fermi level pinning near the valance band; and
    forming a PMOS transistor comprising aluminum-silicon bonds that create predominately Fermi level pinning near the conductive band.

18. The method of claim 17, wherein the $Al_2O_3$ layer is deposited by Atomic Layer Deposition (ALD).

19. The method of claim 17, wherein the hafnium based oxide layer is $HfO_2$.

20. The method of claim 17, wherein the hafnium based oxide layer is HfSiO.

* * * * *